United States Patent
Granig

(10) Patent No.: US 10,773,666 B2
(45) Date of Patent: Sep. 15, 2020

(54) HIGH SPEED SENSOR INTERFACE

(71) Applicant: Infineon Technologies AG, Neubiberg (DE)

(72) Inventor: Wolfgang Granig, Seeboden (AT)

(73) Assignee: Infineon Technologies AG, Neubiberg (DE)

(*) Notice: Subject to any disclaimer, the term of this patent is extended or adjusted under 35 U.S.C. 154(b) by 318 days.

(21) Appl. No.: 15/974,491

(22) Filed: May 8, 2018

(65) Prior Publication Data

US 2019/0344735 A1    Nov. 14, 2019

(51) Int. Cl.
  B60R 16/023    (2006.01)
(52) U.S. Cl.
  CPC ...... B60R 16/0238 (2013.01); B60R 16/0232 (2013.01)
(58) Field of Classification Search
  CPC .............. B60R 16/023; B60R 16/0238; B60R 16/0232; B60R 16/06
  See application file for complete search history.

(56) References Cited

U.S. PATENT DOCUMENTS

| | | | | |
|---|---|---|---|---|
| 2011/0088674 A1* | 4/2011 | Shutty | .................... | F02M 26/05 123/568.21 |
| 2014/0062777 A1* | 3/2014 | MacGougan | ........... | G01S 19/40 342/357.43 |
| 2015/0066349 A1* | 3/2015 | Chan | ....................... | G01C 21/26 701/400 |
| 2018/0157701 A1* | 6/2018 | Hiroki | ....................... | G07C 5/08 |
| 2018/0172484 A1* | 6/2018 | Hammerschmidt | .... | H04L 67/12 |

FOREIGN PATENT DOCUMENTS

EP    0719928 A2    3/1996

OTHER PUBLICATIONS

CAN Specification 2.0, Part A, "Part A", CAN in Automation, Am Weichselgarten 26, D-91058 Erlangen, http://www.port.de/fileadmin/user_upload/Dateien_IST_fuer_Migration/CAN20A.pdf, retrieved May 8, 2018, 31 pages.

(Continued)

*Primary Examiner* — Edwin A Young

(74) *Attorney, Agent, or Firm* — Harrity & Harrity, LLP

(57) ABSTRACT

An ECU may include a PCB, a processor, and a sensor interface component. The sensor interface component and the processor may be disposed on the PCB. The sensor interface component may obtain, from a sensor, a plurality of data samples corresponding to a physical parameter relating to a vehicle component, and generate estimation data based on the plurality of data samples. The estimation data may at least partially compensate for a delay, from a point in time at which a particular data sample is detected by the sensor to a point in time at which the particular data sample is obtained by the sensor interface component, to approximate a current value of the physical parameter. The sensor interface component may receive one or more commands for physical parameter information, relating to the vehicle component, and provide a portion of the estimation data based on the one or more commands.

20 Claims, 13 Drawing Sheets

(56) References Cited

OTHER PUBLICATIONS

CAN Specification 2.0, Part B, "Part B", CAN in Automation, Am Weichselgarten 26, D-91058 Erlangen, ftp://ztchs.p.lodz.pl/Interfejsy_w_Systemach_Mikroprocesorowych/CAN20B-1.pdf, retrieved May 8, 2018, 38 pages.
Bretterklieber et al., "Capacitance Mismatch Correction for a Fluidic Inclinometer", 12MTC 2009—International Instrumentation and Measurement Technology Conference, May 2009, 6 pages.
Marchthaler et al., "Kalman filter", 2017, chapter 1, 19 pages.
Infineon, "High Speed CAN Transceiver", Jul. 15, 2016, 31 pages.
SAE International, "Surface Vehicle Information Report, J2716", Nov. 19, 2015, 120 pages.
Rhudy et al., "A Kalman Filtering Tutorial for Undergraduate Students", International Journal of Computer Science & Engineering Survey (IJCSES) vol. 8, No. 1, Feb. 2017, 18 pages.
Palestri et al. "Development of a new data link layer for a high speed interface", Università degli studi di Udine, 2014-2015, 95 pages.
PSI5, "Peripheral Sensor Interface for Automotive Applications", https://psi5.org/fileadmin/user_upload/01_psi5.org/04_Specification/Specifications_PDFs/PSI5_spec_v2d2_airbag.pdf, Aug. 2016, 65 pages.
Infineon, "SPC2014 Specification", Mar. 16, 2015, 43 pages.
Infineon, "Angle Sensor, TLE5012B", Feb. 2014, 50 pages.
NXP Semiconductors, "UM10204 I2C-bus specification and user manual", https://www.nxp.com/docs/en/user-guide/UM10204.pdf, Apr. 4, 2014, 64 pages.
Ramsey Faragher, "Understanding the Basis of the Kalman Filter Via a Simple and Intuitive Derivation" IEEE Signal Processing Magazine, Sep. 2012, 5 pages.

\* cited by examiner

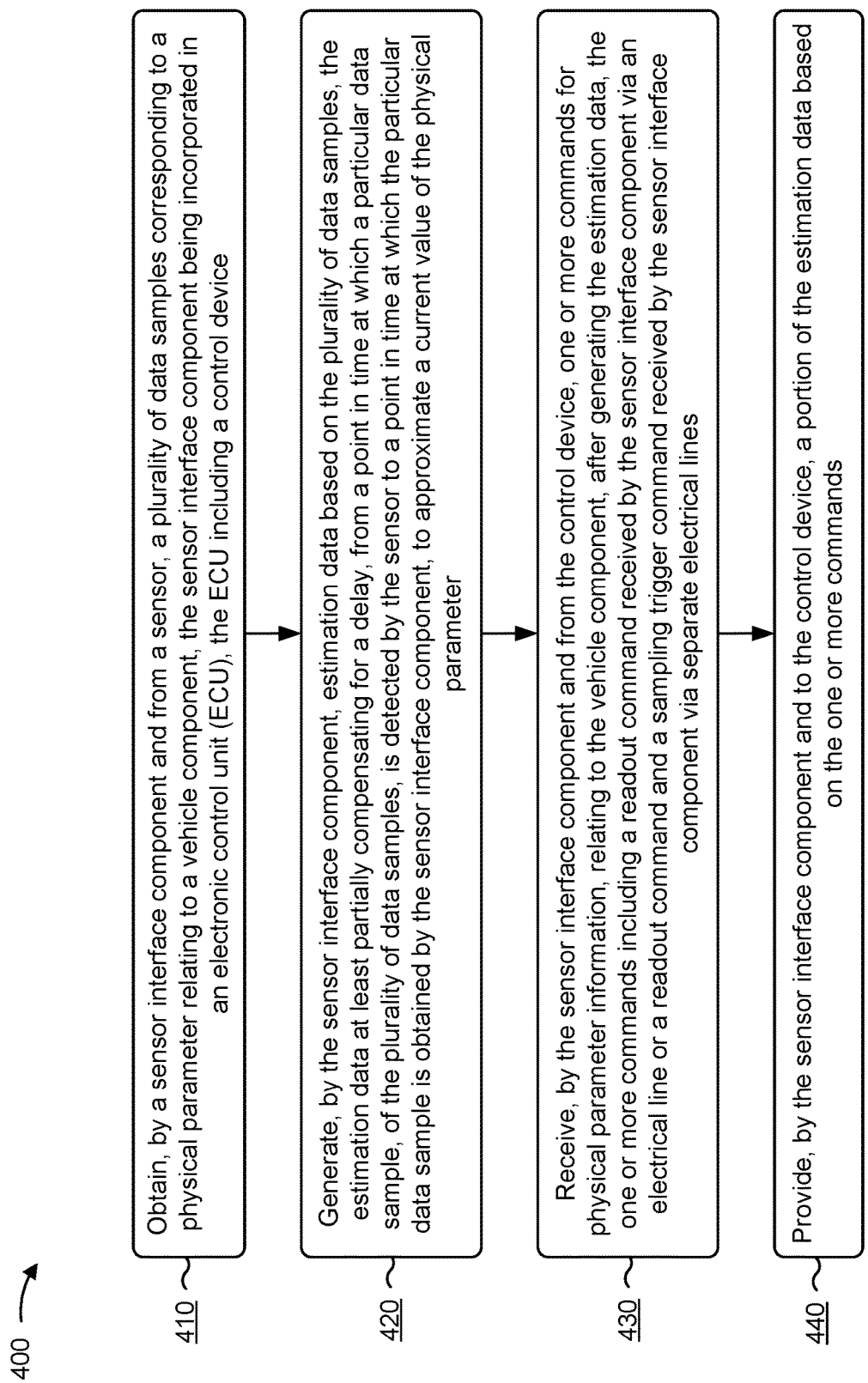

HIGH SPEED SENSOR INTERFACE

BACKGROUND

An electronic control unit (ECU) controls various systems in a vehicle. An ECU typically includes a microcontroller and other components, such as interface circuitry, memory, and/or the like, mounted on a printed circuit board (PCB). The ECU receives inputs from sensors—e.g., data samples corresponding to physical parameters (e.g., position (e.g., linear or angular position), electrical current, velocity, torque, pressure, and/or the like) relating to vehicle components (e.g., motor drives, throttles, levers, and/or the like)—and outputs appropriate control signals based on the sensor inputs.

SUMMARY

According to some implementations, a method may include obtaining, by a sensor interface component and from a sensor, a plurality of data samples corresponding to a physical parameter relating to a vehicle component. The sensor interface component may be incorporated in an electronic control unit (ECU). The ECU may include a control device. The method may include generating, by the sensor interface component, estimation data based on the plurality of data samples. The estimation data may at least partially compensate for a delay, from a point in time at which a particular data sample, of the plurality of data samples, is detected by the sensor to a point in time at which the particular data sample is obtained by the sensor interface component, to approximate a current value of the physical parameter. The method may include receiving, by the sensor interface component and from the control device, one or more commands for physical parameter information, relating to the vehicle component, after generating the estimation data. The one or more commands may include a readout command received by the sensor interface component via an electrical line, or a readout command and a sampling trigger command received by the sensor interface component via separate electrical lines. The method may include providing, by the sensor interface component and to the control device, a portion of the estimation data based on the one or more commands.

According to some implementations, an electronic control unit (ECU) may include a printed circuit board (PCB), a processor, and a sensor interface component. The sensor interface component and the processor may be disposed on the PCB. The sensor interface component may be configured to obtain, from a sensor, a plurality of data samples corresponding to a physical parameter relating to a vehicle component. The sensor may be external to the ECU. The sensor interface component may be configured to generate estimation data based on the plurality of data samples. The estimation data may at least partially compensate for a delay, from a point in time at which a particular data sample, of the plurality of data samples, is detected by the sensor to a point in time at which the particular data sample is obtained by the sensor interface component, to approximate a current value of the physical parameter. The sensor interface component may be configured to receive, from the processor, one or more commands for physical parameter information, relating to the vehicle component, after generating the estimation data, and provide, to the processor, a portion of the estimation data based on the one or more commands.

According to some implementations, a system may include a sensor and an electronic control unit (ECU). The ECU may include a processor, and a sensor interface component, communicatively coupled to the processor, to receive, from the sensor, measurement data corresponding to a physical parameter relating to a vehicle component, determine, based on the measurement data, prediction data that approximates a current value of the physical parameter, and cause portions of the prediction data to be provided to the processor based on requests submitted by the processor.

BRIEF DESCRIPTION OF THE DRAWINGS

FIG. 4 is a flow chart of an example process for generating estimation data based on data samples, provided by a sensor, that correspond to a physical parameter relating to a vehicle component.

DETAILED DESCRIPTION

Figure 1A:
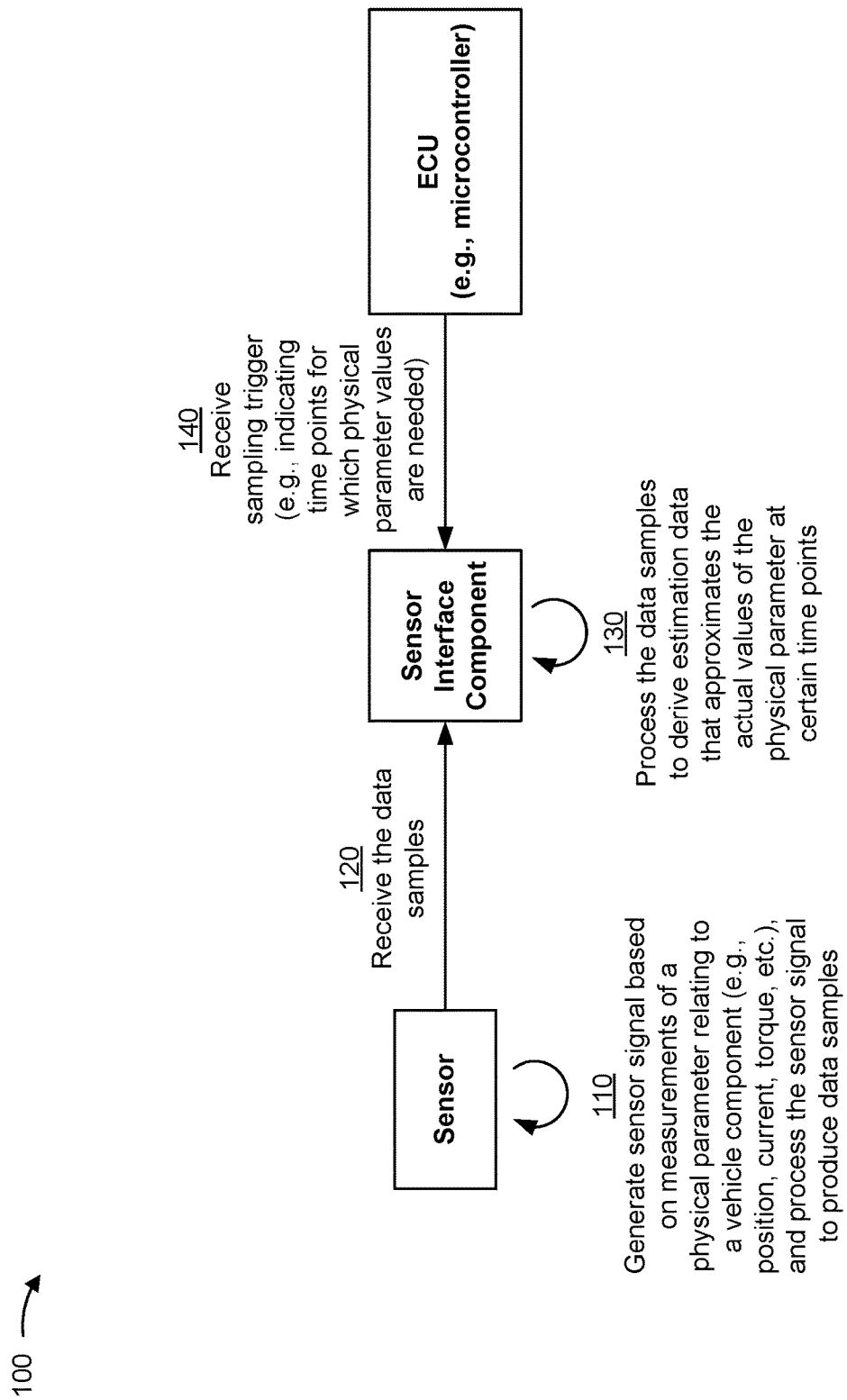
FIGS. 1A-1J are diagrams of an overview of an example implementation described herein.

The following detailed description of example implementations refers to the accompanying drawings. The same reference numbers in different drawings may identify the same or similar elements.

A vehicle sensor typically measures a physical parameter of a vehicle component, processes the measurements (e.g., by performing analog-to-digital conversion (ADC) processing, digital signal processing (DSP), and/or the like), and provides measurement samples to an ECU over a long transmission line (e.g., a 2-meter long cable). This introduces delays—i.e., data path delays, in connection with data processing at the sensor, and transmission delays (as well as wire parasitics) over the line—from a time at which a given measurement is taken by the sensor to a time at which a corresponding measurement sample is received by the ECU. Such delays limit the ECU's ability to provide proper system control, since the ECU needs measurement values at certain sampling times or intervals, and the received measurement samples are not time synchronized due to the delays. In some cases, the data transfer speed, of a communication interface between the sensor and the ECU, may be increased to address the transmission delays. However, doing so requires additional energy or power resources and increases the overall system design cost.

Some implementations, described herein, provide a sensor interface component (e.g., an intelligent interface configuration) that is capable of receiving, from a sensor, data samples corresponding to a physical parameter (e.g., a position (e.g., a linear position, an angular position, and/or the like), an electrical current, a voltage, a velocity, a pressure, a torque, and/or the like) relating to a vehicle component (e.g., a motor drive, a throttle, a lever, and/or the like, such as those included in an electric power steering (EPS) system and/or the like), and processing the data samples (e.g., using one or more of interpolation, prediction, and/or statistical filtering techniques) to derive estimation data. The estimation data may at least partially compensate for a delay, from a point in time at which a particular measurement is made by the sensor to a point in time at which a corresponding data sample is obtained by the sensor interface component, to approximate an actual or current value of the physical parameter. In some implementations, the sensor interface component may be disposed within close proximity to an ECU (e.g., the sensor interface component may be implemented in hardware and disposed on a PCB of the ECU, implemented in hardware within a processor (e.g., a microcontroller) of the ECU, and/or implemented in firmware within the processor), may obtain sampling triggers and/or readout commands from the processor (e.g., the microcontroller) for physical parameter values relating to the vehicle component at specific time points, and may provide, to the ECU, corresponding portions of the estimation data. In this way, the sensor interface component may "reconstruct," based on data samples received from the sensor, predicted data that represents the real behavior of the vehicle component (e.g., the actual or current position, electrical current, voltage, velocity, pressure, and/or the like relating to the vehicle component). This enables the ECU to define measurement time points needed in internal algorithmic state-estimations, and receive (e.g., on demand, such as in real-time or near real-time), from the sensor interface component, measurement data that closely approximates (e.g., that is time synchronized with) the actual values of a physical parameter relating to the vehicle component.

In addition, having a dedicated sensor interface component permits the continued use of standard communication interfaces (e.g., a peripheral sensor interface 5 (PSI5), a serial peripheral interface (SPI), an inter-integrated circuit ($I^2C$)-based interface, a short pulse width modulation code (SPC)-based interface, and/or the like) associated with sensors, which reduces or eliminates a need to increase the data transfer speeds of such communication interfaces (since mechanical movements of vehicle components, such as motor drives, throttles, levers, and/or the like, are limited in speed by mechanical inertia, and thus relatively prompt receipt of physical parameter values by the ECU will be sufficient), thereby conserving power resources that would otherwise be needed to achieve higher data transfer speeds.

FIGS. 1A-1J are diagrams of an overview of an example implementation 100 described herein. As shown in FIG. 1A, example implementation 100 may include a sensor, a sensor interface component, and an ECU. The sensor may include one or more devices capable of measuring a physical parameter (e.g., an "application position") relating to a vehicle component (e.g., a motor drive, a throttle, a lever, and/or the like). The ECU may include a processor (e.g., a microcontroller and/or the like). In some implementations, the ECU may include a PCB on which the processor and/or other components may be disposed. In various implementations, the sensor interface component may be implemented in hardware and/or firmware, as described in more detail below. In some implementations, the sensor interface component may include one or more components or elements configured to process data received from the sensor, and provide the processed data to the ECU.

As used herein, a processor includes a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), and/or another type of processing component.

In some implementations, the sensor interface component may be communicatively coupled to the sensor via a communication interface (e.g., a PSI5, an SPI, an $I^2C$-based interface, an SPC-based interface, and/or the like) and one or more wired links. In a case where the sensor interface component is communicatively coupled to the sensor via an SPI, a shorter wired link may be used relative to another type of communication interface.

In some implementations, the sensor interface component may be communicatively coupled to the processor (e.g., the microcontroller) via a communication interface (e.g., an SPI, a parallel interface, and/or the like) and one or more wired links (e.g., link(s) that are much shorter than the link between the sensor interface component and the sensor). In some implementations, the sensor interface component may be communicatively coupled to the processor via a communication interface that permits data transfer at higher (or greater) speeds than that permitted by the communication interface between the sensor interface component and the sensor. In some implementations, the sensor interface component may be communicatively coupled to the processor via a communication interface that permits data transfer at speeds that are equal to or lower than that permitted by the communication interface between the sensor interface component and the sensor. Even at low data transfer rates between the sensor interface component and the processor and/or between the sensor interface component and the sensor, for example, the data estimation functionality provided by the sensor interface component may enable the ECU to receive time synchronized physical parameter values (at relatively short delays) that closely approximate the actual physical parameter value(s) relating to the vehicle component.

As shown in FIG. 1A, and as shown by reference number 110, the sensor may generate a sensor signal based on measurements of a physical parameter relating to a vehicle component, and process the sensor signal to produce data samples. The physical parameter may include a position (e.g., a linear position, an angular position, and/or the like), an electrical current, a voltage, a velocity, a pressure, a torque, and/or the like.

In some implementations, the sensor may conduct the measurements and/or generate the sensor signal periodically, continuously, based on an input (e.g., from the sensor interface component and/or the ECU). In some implementations, the sensor may process the sensor signal using an analog-to-digital converter and/or one or more DSP-related components (not shown).

As shown by reference number 120, the sensor interface component may receive the data samples from the sensor. As shown by reference number 130, the sensor interface component may process the data samples to derive estimation data that approximates the actual values of the physical parameter at certain time points. In some implementations, the sensor interface component may process the data samples as the data samples are received from the sensor.

The sensor interface component may process the data samples using any suitable algorithm, methodology, or technique. In some implementations, the sensor interface component may process the data samples using an interpolation-based technique. An example relating to such a technique is described below with regard to FIG. 1D. In some implementations, the sensor interface component may process the data samples using a prediction-based technique. An example relating to such a technique is described below with regard to FIG. 1E. In some implementations, the sensor interface component may process the data samples using a technique based on interpolation and prediction. An example relating to such a technique is described below with regard to FIG. 1F.

In some implementations, the sensor interface component may process the data samples using a filtering technique. For example, the sensor interface component may process the data samples using a Kalman filtering technique. An example relating to such a technique is described below with regard to FIG. 1G. In some implementations, the sensor interface component may process the data samples using a feedback-based technique. For example, the sensor interface component may process the data samples using a Kalman filtering technique that employs feedback signals provided by the ECU. An example relating to such a technique is described below with regard to FIG. 1H.

Although not shown, the sensor interface component may, as described above, be implemented in hardware. For example, the sensor interface component may include various hardware components (e.g., circuitry and/or the like) configured to provide the data sample processing functions (e.g., an interpolation function, a prediction function, an interpolation function in combination with a prediction function, a Kalman filtering function, and/or the like). Additionally, or alternatively, the sensor interface component may be implemented in firmware. For example, the sensor interface component may include various elements (e.g., modules) configured to provide the data sample processing function(s).

As shown by reference number 140, the sensor interface component may receive, from the ECU (e.g., the microcontroller), a sampling trigger that indicates time point(s) for which physical parameter value(s) are needed. The sampling trigger may, for example, be used for more accurate sample timing.

Figure 1B:
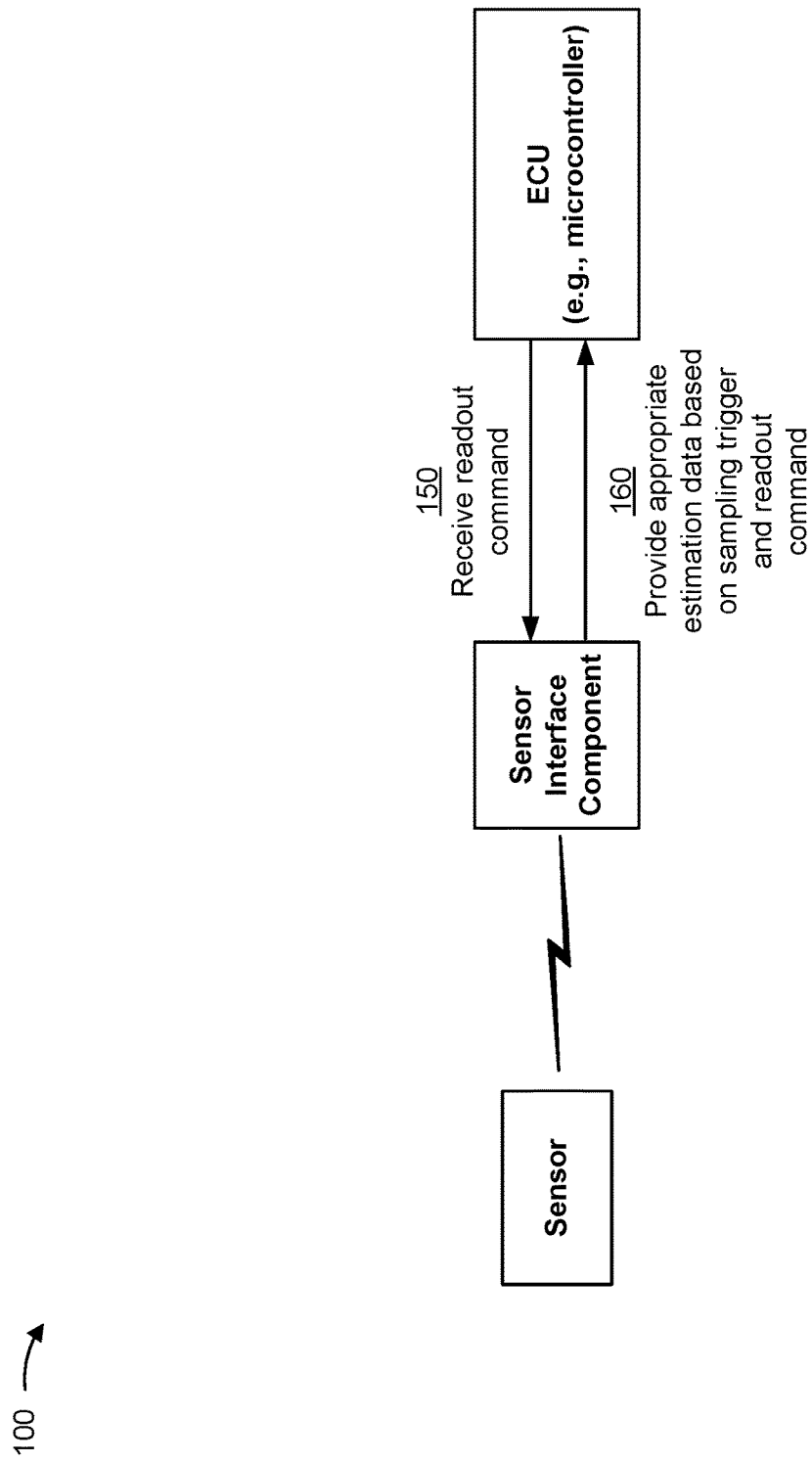

As shown in FIG. 1B, and as shown by reference number 150, the sensor interface component may receive, from the ECU (e.g., the microcontroller), a readout command. In some implementations, the readout command may include an instruction to provide sampled measurements in connection with the time point(s) indicated by the sampling trigger. In some implementations, a sampling trigger may be realized via a readout command, in which case there may or may not be separate sampling triggers and readout commands. As shown by reference number 160, the sensor interface component may provide, to the ECU (e.g., the microcontroller), appropriate estimation data based on the sampling trigger and the readout command (e.g., based on the time point(s) indicated by the sampling trigger).

Figure 1C:
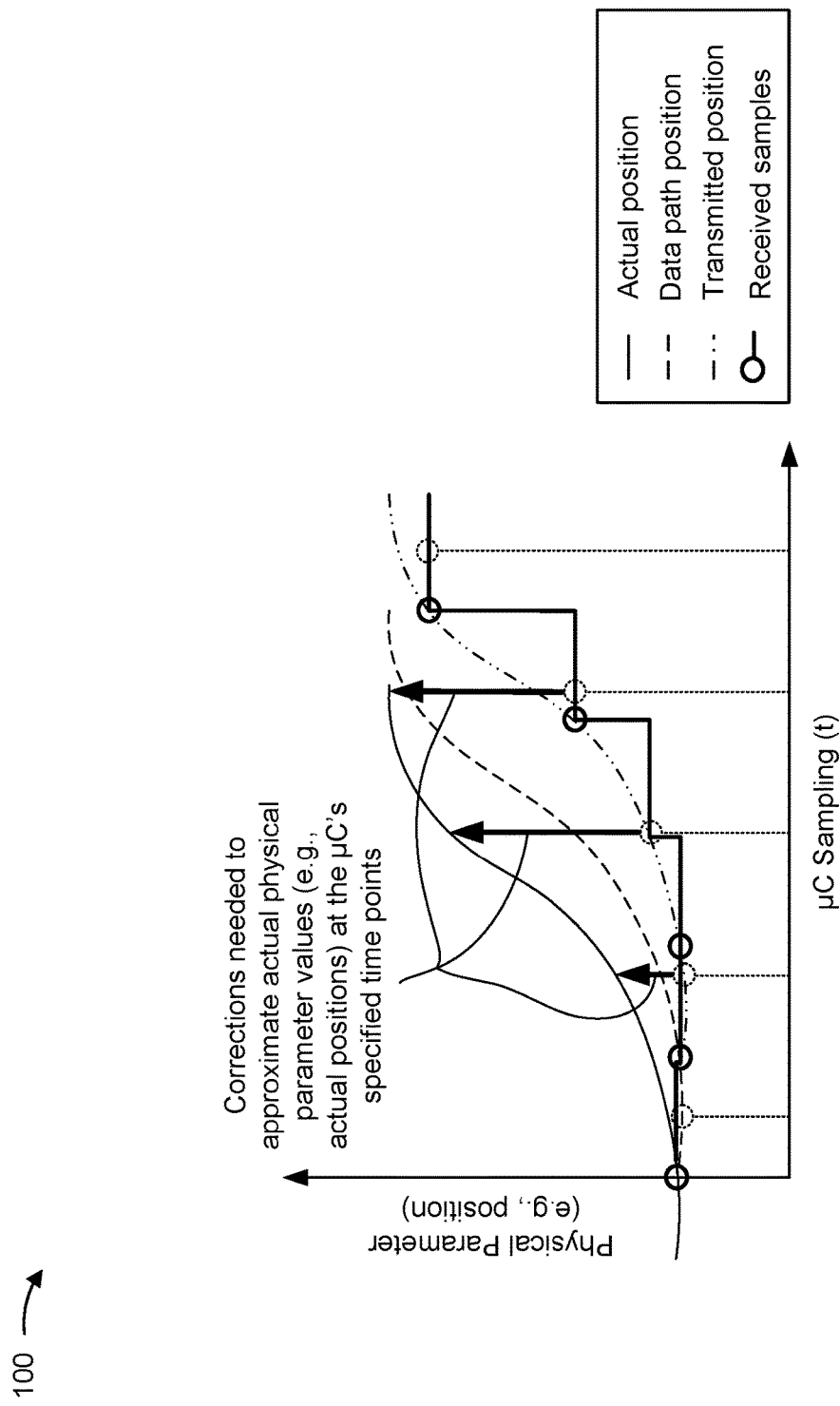

As shown in FIG. 1C, the physical parameter values represented by data samples outputted by a sensor—e.g., the data path position—may be delayed, relative to the actual or current values of the physical parameter—e.g., the actual position, due to data processing delays and/or the like at the sensor. In addition, and as shown in FIG. 1C, the physical parameter values represented by data samples during transmission—e.g., the transmitted position—may be further delayed, relative to the current or actual values of the physical parameter, due to transmission delays over a transmission line. Furthermore, in a case where implementations of the sensor interface component described herein are not used, the physical parameter values represented by data samples that are ultimately received—e.g., the received samples—at the ECU may be still further delayed relative to the current or actual values of the physical parameter. The ECU may thus receive, and operate on, data samples that are outdated, or old, relative to the current or actual values of the physical parameter, which can affect the ECU's ability to properly control the associated vehicle component.

As described above, the sensor interface component may compensate for such data path and transmission delays by approximating the actual values of a physical parameter relating to a vehicle component (e.g., the actual values of the physical parameter at time points for which physical parameter values are needed by the ECU (e.g., the microcontroller)), thus providing time synchronized measurement data to the ECU for proper system control. Here, as shown in FIG. 1C, in a case where implementations of the sensor interface component described herein are used, the sensor interface component, may process the received samples to derive estimation data that reconstructs the real behavior of the vehicle component.

Figure 1D:
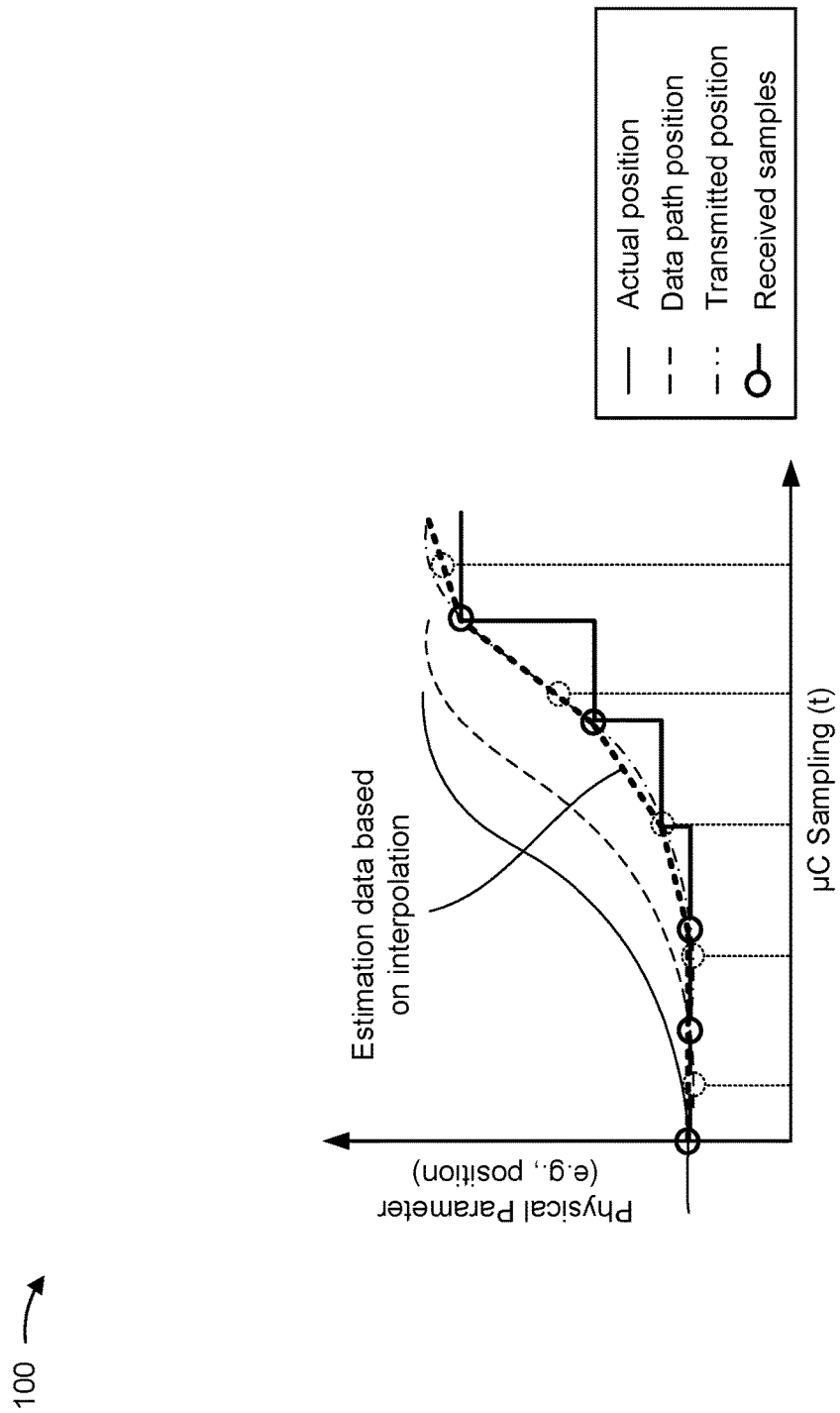

FIG. 1D is a diagram further illustrating an example interpolation technique described above in connection with FIGS. 1A and 1B. As shown in FIG. 1D, the sensor interface component may process the received data samples to derive estimation data—interpolation data. This may at least partially compensate for delays or deviations, relative to the actual or current values of the physical parameter, that are inherent in the step-wise nature (e.g., the sampling-hold functionality) of the received samples signal.

In some implementations, the sensor interface component may perform a linear interpolation. For example, the sensor interface component may perform a linear interpolation in accordance with the following formula (and/or the like):

$$X(ts)=X(t)+(ts/dt)*[X(t)-X(t-1)],$$

where dt is a full time period, and where $X(t)$ and $X(t-1)$ correspond to data samples received from the sensor at different times t and t−1.

Additionally, or alternatively, the sensor interface component may perform a higher order polynomial interpolation, such as a second order polynomial interpolation and/or the like.

Figure 1E:
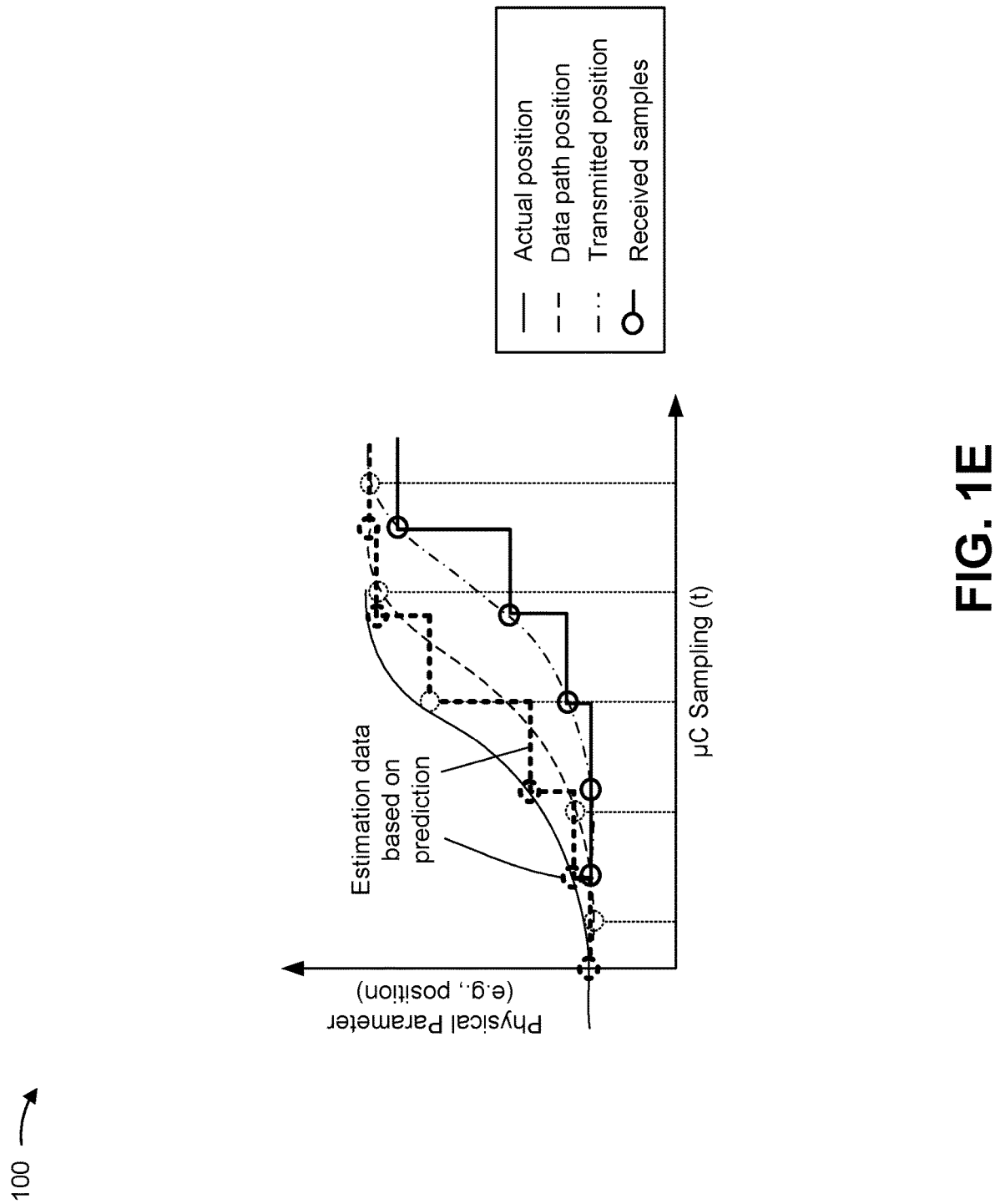

FIG. 1E is a diagram further illustrating an example prediction technique described above in connection with FIGS. 1A and 1B. As shown in FIG. 1E, the sensor interface component may calculate a predicted value based on each received data sample. In some implementations, the sensor interface component may perform a fixed polynomial prediction. While such a prediction may yield a step-function (rather than a smooth curve), this may at least partially compensate for the above-mentioned delays or deviations (e.g., due to data processing, transmission, and/or the like) relative to the current or actual values of the physical parameter.

In some implementations, the sensor interface component may perform a fixed prediction in accordance with the following formula (and/or the like):

$$X(ts)=X(t)+X(t-1)-X(t-2),$$

where $X(t)$, $X(t-1)$, and $X(t-2)$ correspond to data samples received from the sensor at different times t, t−1, and t−2.

Figure 1F:
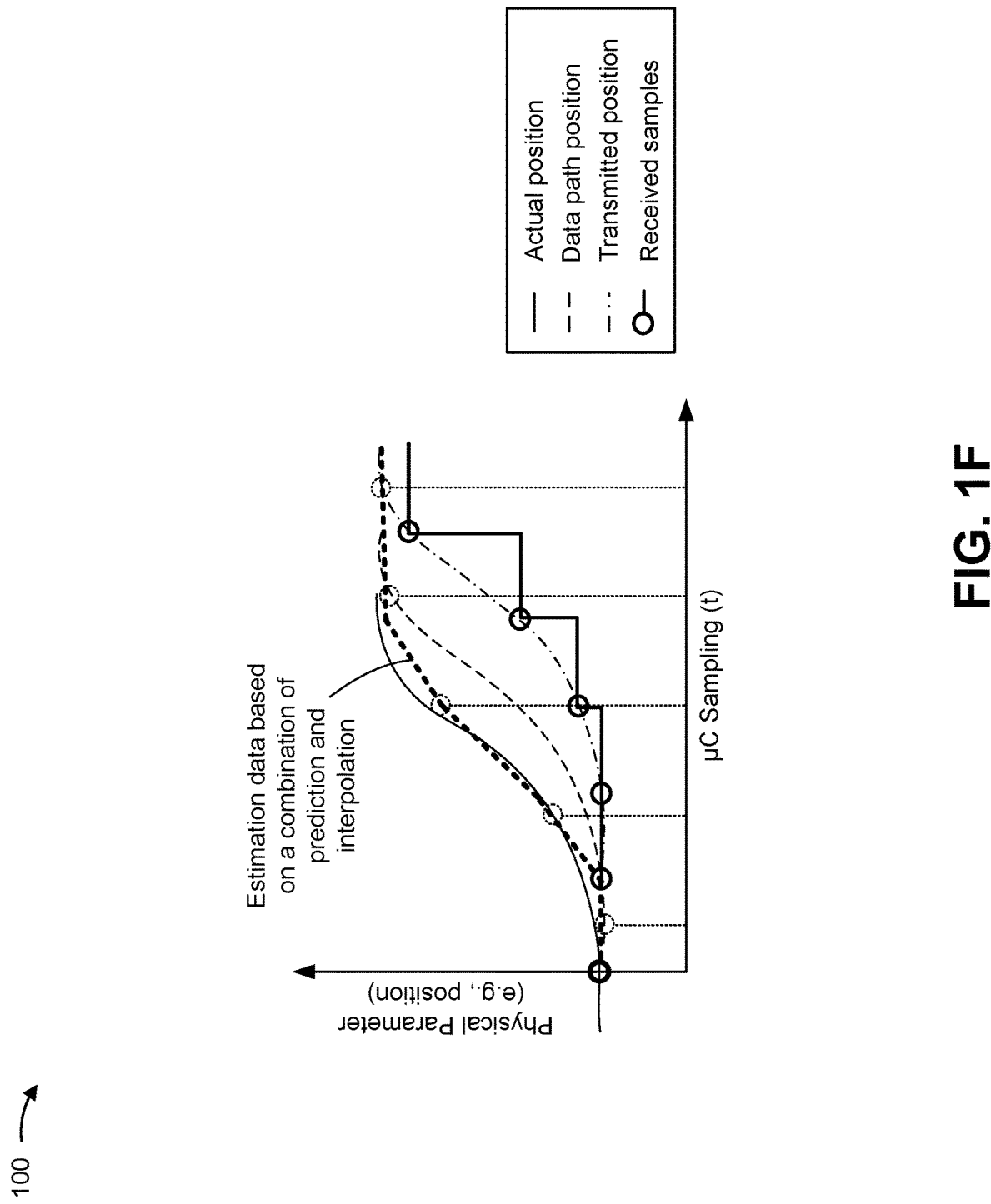

FIG. 1F is a diagram further illustrating an example technique that combines the use of prediction and interpolation described above in connection with FIGS. 1A and 1B. As shown in FIG. 1F, the sensor interface component may derive, based on received data samples, estimation data using a combination of prediction and interpolation so as to reduce the delays or deviations (e.g., due to data processing, transmission, and/or the like). In some implementations, the sensor interface component may combine the example formulas described above in connection with FIGS. 1D and 1E. In some implementations, the sensor interface component may utilize a higher order polynomial function.

Figure 1G:
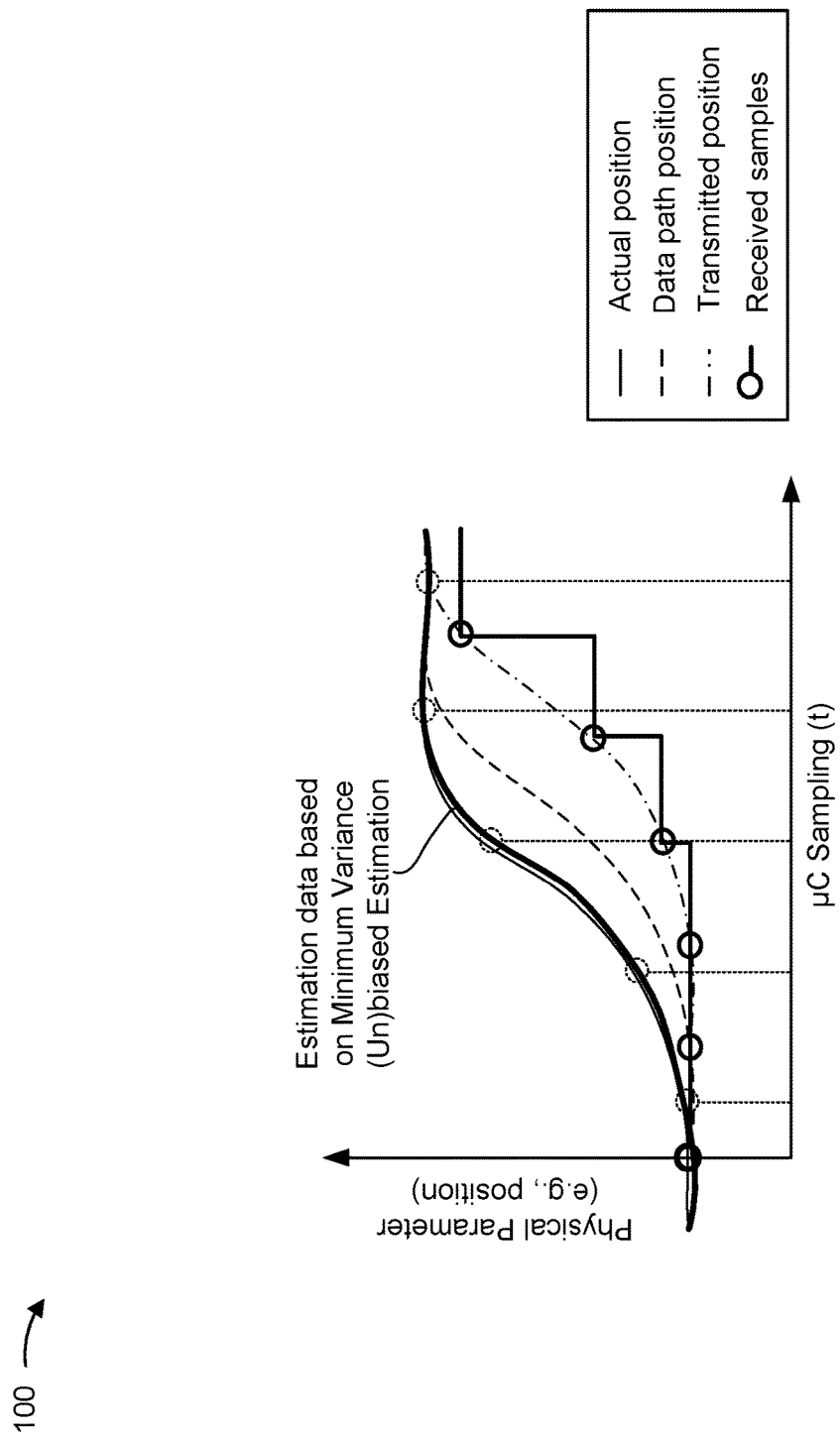

FIG. 1G is a diagram further illustrating an example filtering technique described above in connection with FIGS. 1A and 1B. As shown in FIG. 1G, the sensor interface component may derive, based on received data samples, estimation data using a filtering technique, such as a statistical filtering technique. For example, the sensor interface component may utilize minimum variance unbiased (or biased) estimators (MVUEs) to derive the estimation data. As shown, the estimation data may approximate the current or actual values of the physical parameter very closely over time.

In some cases, the sensor interface component may utilize Bayesian Estimation, such as that used in Kalman filtering. In cases where this results in the use of computing power and/or computing resources that exceeds certain requirements, the estimation techniques (e.g., algorithms) may be simplified, so long as larger deviations, between estimated physical parameter values and the real or actual physical parameter values, are tolerable or acceptable.

For example, a Kalman filter may be configured to operate on systems in a linear state space format, such as a system in accordance with the following:

$$x_k = F_{k-1} x_{k-1} - G_{k-1} u_{k-1} + w_{k-1}, \text{ and}$$

$$y_k = H_k x_k + v_k,$$

where x is a state vector, y is an output vector, u is an input vector, w is a process noise vector, v is a measurement noise vector, F is a system matrix (state), G is a system matrix (input), and H is an observation matrix. Kalman filtering involves recursive or iterative operations where the average state vector and covariances are estimated. Estimates of the state vector can be used to predict values at subsequent time steps, and can be updated each time actual (or real) measurement data is obtained. The recursive nature of Kalman filtering permits real-time execution without a need to store information regarding past estimates.

In some implementations, the sensor interface component may be capable of employing a dynamic interpolation and/or prediction algorithm to derive the estimation data. For example, the sensor interface component may be capable of utilizing feedback (e.g., correction values) provided by the ECU to further optimize the calculation of estimation data (e.g., via smoothing of the data curve).

As an example, and in a case where the physical parameter is an electrical current relating to a motor drive, a deviation, between a value of the electrical current identified by the ECU (e.g., obtained via measurement data) and the real or actual electrical current, may result in higher losses, reduced torque, and/or the like. In such a case, the ECU may provide, to the sensor interface component, correction value (s), relating to the deviation, as feedback to optimize the calculation of the estimation data. In cases where this results in the use of computing power and/or computing resources that exceeds certain requirements, the estimation techniques (e.g., algorithms) may be simplified, so long as larger deviations, between estimated physical parameter values and the real or actual physical parameter values, are tolerable or acceptable.

Figure 1H:
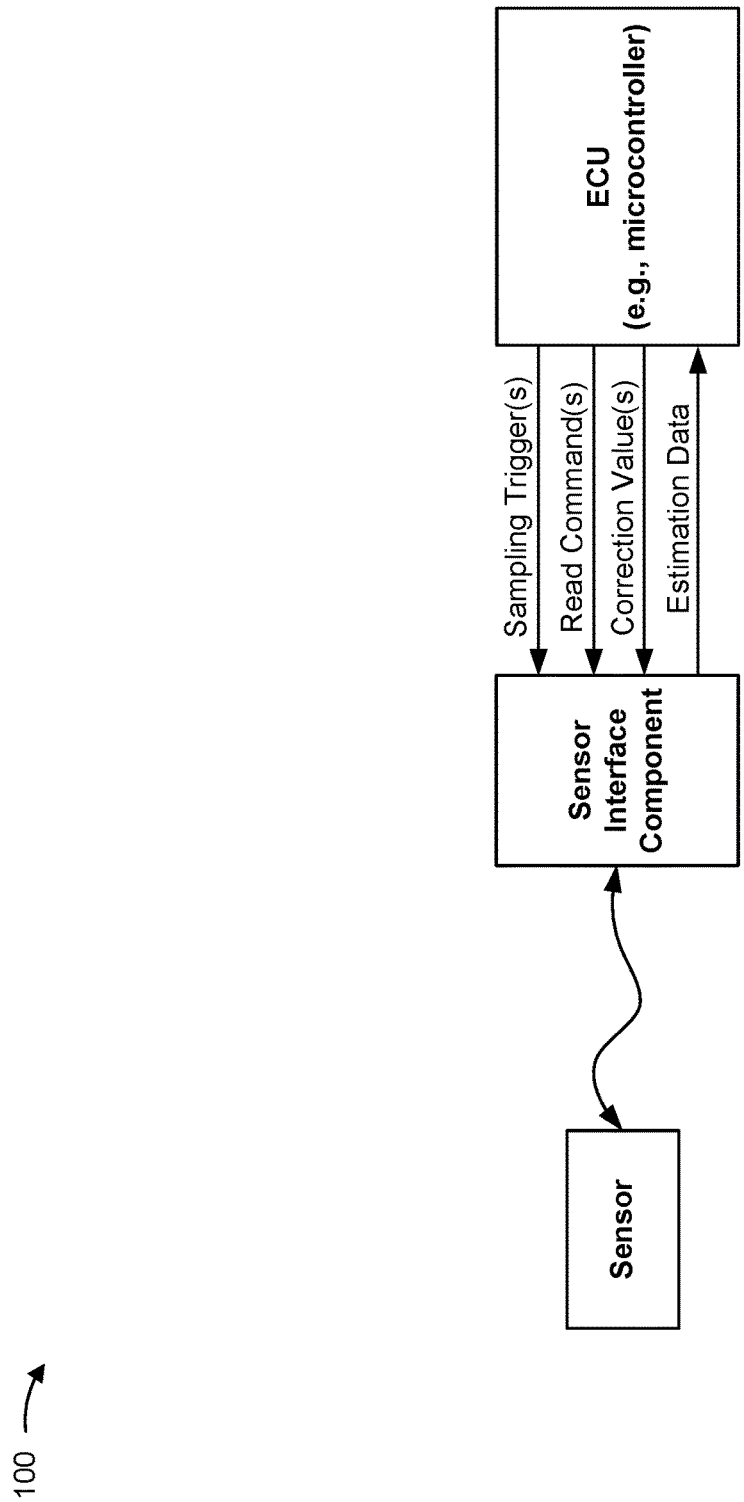

FIG. 1H is a diagram further illustrating an example feedback-based implementation described above in connection with FIGS. 1A and 1B. As shown in FIG. 1H, the sensor interface component may receive sampling triggers and readout commands from the ECU, and provide corresponding estimation data to the ECU. In some implementations, the sampling triggers and the readout commands may be transmitted over separate lines (e.g., separate electrical lines). In some implementations, and as described above, a sampling trigger may be realized via a readout command, in which case there may or may not be a sampling trigger line (e.g., a separate electrical line) between the ECU and the sensor interface component. Here, the sensor interface component may additionally receive correction value(s) from the ECU as feedback (e.g., in the dynamic interpolation/prediction algorithm).

Figure 1I:
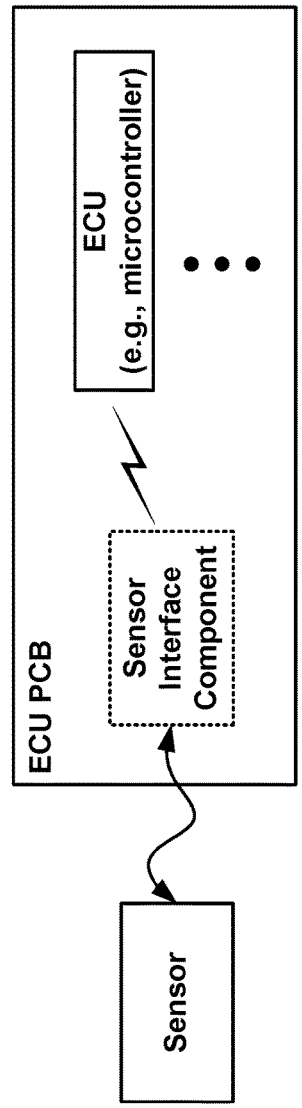
Figure 1J:
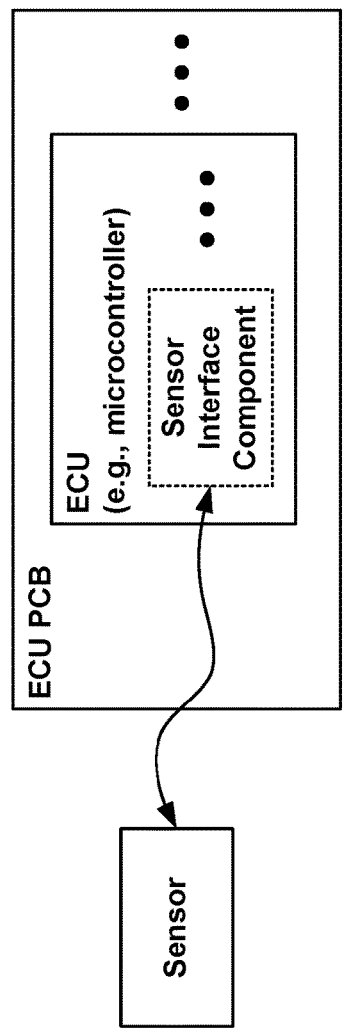

FIGS. 1I and 1J are diagrams that illustrate example implementations of the sensor interface component. As shown in FIG. 1I, and in some implementations, the sensor interface component may be implemented in hardware as a standalone component on the ECU PCB. In such cases, the sensor interface component may be located within close proximity to the ECU (e.g., the microcontroller). In some implementations, the sensor interface component may include various circuitry that provide the functionality described above for deriving or generating estimation data. In some implementations, the sensor interface component may be implemented in an integrated circuit (e.g., an application-specific integrated circuit (ASIC) chip).

In some implementations, to address any electromagnetic interference (EMI) and/or electrostatic discharge (ESD) issues to which the transmission line (between the sensor and the sensor interface component) may be susceptible, the sensor interface component may include, or be coupled to, one or more EMI/ESD-related filtering components that suppress EMI/ESD noise.

Alternatively, as shown in FIG. 1J, and in some implementations, the sensor interface component may be integrated in the ECU—e.g., in the microcontroller of the ECU. In some implementations, the sensor interface component may be implemented in hardware (e.g., including various circuitry) within the microcontroller. In such cases, the microcontroller may include one or more additional peripheral devices that interface the sensor interface component and a processing unit of the microcontroller, and may additionally include, or be coupled to, one or more EMI/ESD-related filtering components within the microcontroller. Additionally, or alternatively, the sensor interface component may be implemented in firmware (e.g., stored in non-volatile memory (e.g., a read-only memory (ROM) in the microcontroller)).

In some implementations, the microcontroller, or another component of the ECU, may receive and store the data samples from the sensor in one or more memory locations (e.g., register(s)). In such cases, the sensor interface component (whether implemented in hardware and/or firmware) may obtain the data samples from the memory location(s) for processing to derive the estimation data.

As indicated above, FIGS. 1A-1J are provided merely as examples. Other examples are possible and may differ from what was described with regard to FIGS. 1A-1J. For example, although some implementations of the sensor interface component are described herein with respect to specific formulas for processing the data samples received from the sensor, other formulas may be used with various implementations, so long as the sensor interface component can derive the estimation data based on interpolation, prediction, statistical filtering, and/or the like. Furthermore, although some implementations are described herein as being applicable to certain vehicle contexts, various implementations of the sensor interface component may be equally or similarly applied in any system where time synchronized data is needed at minimal delays.

Figure 2:
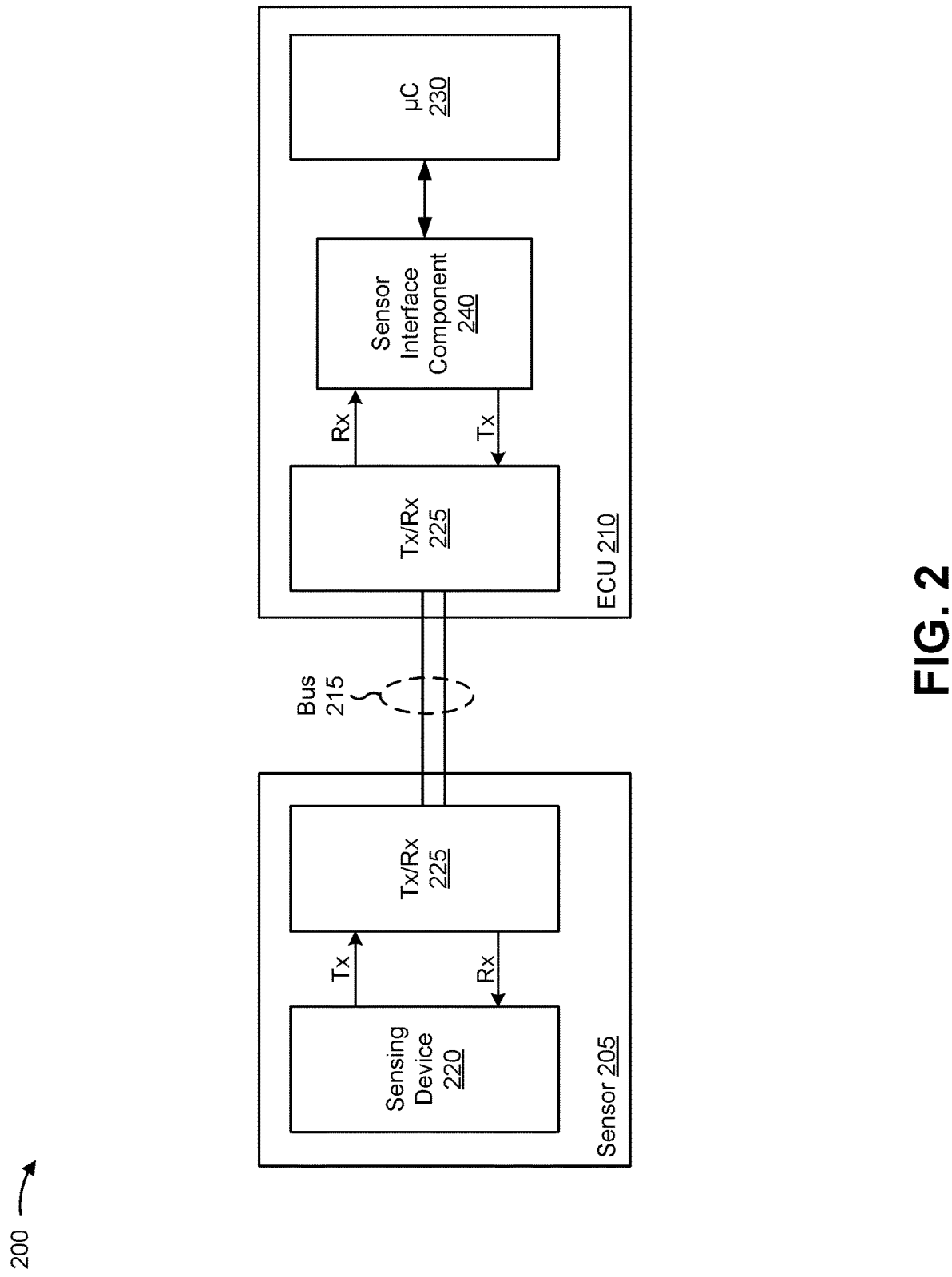
FIG. 2 is a diagram of an example environment in which techniques, devices, systems, and/or methods, described herein, may be implemented.

FIG. 2 is a diagram of an example environment 200 in which techniques, devices, systems, and/or methods described herein may be implemented. As shown in FIG. 2, environment 200 may include a sensor 205 connected to an ECU 210 via a sensor interface bus 215 (herein referred to as bus 215).

Sensor 205 includes a housing associated with one or more components of a sensor for measuring one or more characteristics or physical parameters (e.g., a speed of an object, a position of an object, an angle of rotation of an object, an amount of pressure, a temperature, an amount of current, an amount of voltage, and/or the like). As shown, sensor 205 includes a sensing device 220 and a transceiver (Tx/Rx) 225. In some implementations, sensor 205 is remote from ECU 210 and, thus, is connected to ECU 210 via bus 215 (e.g., via a wired connection).

Sensing device 220 includes a device capable of performing a sensing function (e.g., sampling a sensor signal, calculating and/or determining sensor data, and/or the like). In some implementations, sensing device 220 may include one or more sensing elements, an analog-to-digital convertor, a digital signal processor, a memory component, a digital interface, and/or the like that enable performance of the sensing function.

Transceiver 225 includes a component via which a device (e.g., sensor 205, ECU 210, or sensor interface component 240) may transmit and receive information. For example, transceiver 225 may include a differential line transceiver or a similar type device. In some implementations, transceiver 225 includes a transmit (Tx) component that allows sensor 205 to transmit information (e.g., data samples and/or the like) to sensor interface component 240 and/or ECU 210 via bus 215, and a receive (Rx) component that allows sensor 205 to receive information from sensor interface component 240 and/or ECU 210 via bus 215. In some implementations, transceiver 225 may include a line driver for enabling the Tx component to transmit information, or the Rx component to receive information, at a given time.

Bus 215 includes a sensor interface bus for carrying information between sensor 205 and sensor interface component 240 and/or ECU 210. In some implementations, bus 215 may include a connection (e.g., including one or more wires and connectors) via which sensor 205 is connected to sensor interface component 240 and/or ECU 210. In some implementations, bus 215 may include a set of connections, each associated with one or more sensors 205 connected to sensor interface component 240 and/or ECU 210 (e.g., when multiple sensors 205 are connected to sensor interface component 240 and/or ECU 210 via one or more busses 215). In some implementations, a given connection may be capable of carrying a signal from sensor interface component 240 and/or ECU 210 to sensor 205 and carrying a signal from sensor 205 to sensor interface component 240 and/or ECU 210 (e.g., via a same wire or via a different wire).

ECU 210 includes one or more devices associated with controlling one or more electrical systems and/or electrical subsystems based on sensor data provided by sensor 205. As shown, ECU 210 may include a transceiver 225 and a microcontroller (µC) 230. In some implementations, microcontroller 230 may be capable of calibrating, controlling, adjusting, and/or the like the one or more electrical systems and/or electrical subsystems based on sensor data transmitted by sensor 205. For example, in some implementations, microcontroller 230 may include an electronic/engine control module (ECM), a powertrain control module (PCM), a transmission control module (TCM), a brake control module (BCM or EBCM), a central control module (CCM), a central timing module (CTM), a general electronic module (GEM), a body control module (BCM), a suspension control module (SCM), or another electrical system or electrical subsystem of a vehicle.

Sensor interface component 240 includes one or more components and/or devices configured to receive, process, and/or transmit data in connection with sensor 205 and/or ECU 210 (e.g., microcontroller 230). For example, sensor interface component 240 may receive, from sensor 205, data samples corresponding to physical parameters relating to vehicle components, process the data samples to generate estimation data, and provide the estimation data to microcontroller 230, as described elsewhere herein.

Sensor interface component 240 may be incorporated in ECU 210, and may be implemented in hardware and/or firmware, as described elsewhere herein. For example, in some implementations, sensor interface component 240 may be implemented in logic circuitry (e.g., in an ASIC). As another example, in some implementations, sensor interface component 240 may be implemented in application logic. Although sensor interface component 240 is shown as being separate from microcontroller 230, in some implementations, sensor interface component 240 may be incorporated within microcontroller 230 (e.g., as hardware and/or firmware within microcontroller 230), as described elsewhere herein. Furthermore, although sensor interface component 240 is shown as being separate from transceiver 225, in some implementations, sensor interface component 240 may include transceiver 225.

The number and arrangement of apparatuses shown in FIG. 2 is provided as an example. In practice, there may be additional devices and/or components, fewer devices and/or components, different devices and/or components, or differently arranged devices and/or components than those shown in FIG. 2. For example, in some implementations, environment 200 may include multiple sensors 205, each connected to sensor interface component 240 and/or ECU 210 via one or more associated busses 215. Furthermore, two or more devices and/or components shown in FIG. 2 may be implemented within a single device and/or component, or a single device and/or a single component shown in FIG. 2 may be implemented as multiple, distributed devices and/or components. Additionally, or alternatively, a set of devices and/or components (e.g., one or more devices and/or components) of FIG. 2 may perform one or more functions described as being performed by another set of devices and/or components of FIG. 2.

Figure 3:
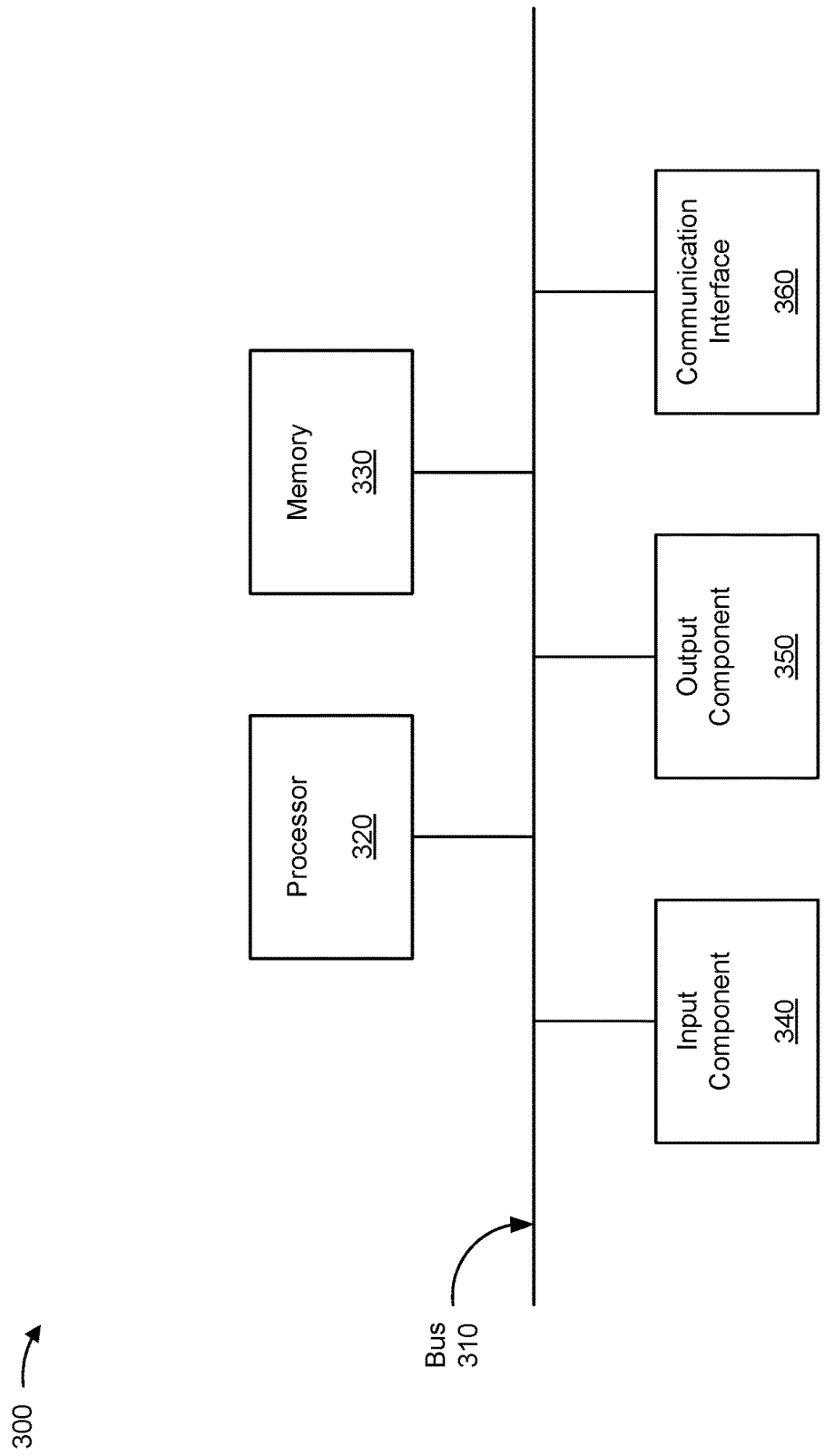
FIG. 3 is a diagram of example components of one or more devices of FIG. 2.

FIG. 3 is a diagram of example components of a device 300. Device 300 may correspond to sensor 205, ECU 210, microcontroller 230, and/or sensor interface component 240 of FIG. 2. In some implementations, sensor 205, ECU 210, microcontroller 230, and/or sensor interface component 240 may include one or more devices 300 and/or one or more components of device 300. As shown in FIG. 3, device 300 may include a bus 310, a processor 320, a memory 330, an input component 340, an output component 350, and a communication interface 360.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Input component 340 includes a component that permits device 300 to receive information, such as via user input (e.g., a touch screen display, a keyboard, a keypad, a mouse, a button, a switch, and/or a microphone) or instructions provided by another device. Output component 350 includes a component that provides output information from device 300 (e.g., a display, a speaker, and/or one or more light-emitting diodes (LEDs)).

Communication interface 360 includes a transceiver-like component (e.g., a transceiver and/or a separate receiver and transmitter) that enables device 300 to communicate with other devices, such as via a wired connection, a wireless connection, or a combination of wired and wireless connections. Communication interface 360 may permit device 300 to receive information from another device and/or provide information to another device. For example, communication interface 360 may include a PSI5, an SPI, an I²C-based interface, an SPC-based interface, and/or the like. As another example, communication interface 360 may include an Ethernet interface, an optical interface, a coaxial interface, an infrared interface, a radio frequency (RF) interface, a universal serial bus (USB) interface, a wireless local area network, a cellular network interface, and/or the like.

Device 300 may perform one or more processes described herein. Device 300 may perform these processes based on processor 320 executing software instructions stored by a non-transitory computer-readable medium, such as memory 330. A computer-readable medium is defined herein as a non-transitory memory device. A memory device includes memory space within a single physical storage device or memory space spread across multiple physical storage devices.

Software instructions may be read into memory 330 from another computer-readable medium or from another device via communication interface 360. When executed, software instructions stored in memory 330 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

FIG. 4 is a flow chart of an example process 400 for generating estimation data based on data samples, provided by a sensor, that correspond to a physical parameter relating to a vehicle component. In some implementations, one or more process blocks of FIG. 4 may be performed by sensor interface component 240. In some implementations, one or more process blocks of FIG. 4 may be performed by another device or a group of devices separate from or including sensor interface component 240, such as sensor 205, ECU 210, microcontroller 230, and/or the like.

As shown in FIG. 4, process 400 may include obtaining, by a sensor interface component (e.g., sensor interface component 240) and from a sensor (e.g., sensor 205), a plurality of data samples corresponding to a physical parameter relating to a vehicle component, where the sensor interface component is incorporated in an ECU (e.g., ECU 210), and where the ECU includes a control device (e.g., microcontroller 230) (block 410). For example, sensor interface component 240 (e.g., using one or more components of device 300 and/or the like) may obtain, from sensor 205, a plurality of data samples corresponding to a physical parameter relating to a vehicle component. In some implementations, the sensor interface component is incorporated in ECU 210. In some implementations, ECU 210 includes microcontroller 230.

As further shown in FIG. 4, process 400 may include generating, by the sensor interface component, estimation data based on the plurality of data samples, where the estimation data at least partially compensates for a delay, from a point in time at which a particular data sample, of the plurality of data samples, is detected by the sensor to a point in time at which the particular data sample is obtained by the sensor interface component, to approximate a current value of the physical parameter (block 420). For example, sensor interface component 240 (e.g., using one or more components of device 300 and/or the like) may generate estimation data based on the plurality of data samples. In some implementations, the estimation data at least partially compensates for a delay, from a point in time at which a particular data sample, of the plurality of data samples, is detected by sensor 205 to a point in time at which the particular data sample is obtained by sensor interface component 240, to approximate a current value of the physical parameter.

As further shown in FIG. 4, process 400 may include receiving, by the sensor interface component and from the control device, one or more commands for physical parameter information, relating to the vehicle component, after generating the estimation data, where the one or more commands include a readout command received by the sensor interface component via an electrical line or a readout command and a sampling trigger command received by the sensor interface component via separate electrical lines (block 430). For example, sensor interface component 240 (e.g., using one or more components of device 300 and/or the like) may receive, from the control device, one or more commands for physical parameter information, relating to the vehicle component, after generating the estimation data. In some implementations, the one or more commands include a readout command received by sensor interface component 240 via an electrical line, or a readout command and a sampling trigger command received by sensor interface component 240 via separate electrical lines.

As further shown in FIG. 4, process 400 may include providing, by the sensor interface component and to the control device, a portion of the estimation data based on the one or more commands (block 440). For example, sensor interface component 240 (e.g., using one or more components of device 300 and/or the like) may provide, to the control device, a portion of the estimation data based on the one or more commands.

Process 400 may include additional implementations, such as any single implementation or any combination of implementations described below and/or in connection with one or more other processes described elsewhere herein.

In some implementations, the control device may include a processor, and the sensor interface component may be implemented in firmware, or hardware, in the processor. In some implementations, the sensor interface component and the control device may be disposed on a PCB of the ECU, and the sensor interface component may be separate from the control device.

In some implementations, the sensor interface component may be communicatively coupled to the sensor via a first interface that permits data transfer up to a first rate, and may be communicatively coupled to the control device via a second interface that permits data transfer up to a second rate, where the second rate may be greater than the first rate. In some implementations, values of the estimation data may be time synchronized with actual values of the physical parameter relating to the vehicle component.

In some implementations, the sensor interface component may generate the estimation data using interpolation, prediction, and/or statistical filtering. In some implementations, the sensor interface component may receive feedback data from the control device. In some implementations, the sensor interface component may generate the estimation data based on the feedback data.

In some implementations, the physical parameter may include a linear position, an angular position, an electrical current, a voltage, a velocity, a pressure, or a torque. In some implementations, the estimation data may further compensate for noise in the plurality of data samples. In some implementations, the sensor interface component may be communicatively coupled to the sensor via a PSI5, an SPI, an $I^2C$-based interface, or an SPC-based interface.

In some implementations, an ECU (e.g., ECU 210) may include a PCB, a processor (e.g., microcontroller 230), and a sensor interface component (e.g., sensor interface component 240). In some implementations, the sensor interface component and the processor may be disposed on the PCB. In some implementations, the sensor interface component may be configured to obtain, from a sensor (e.g., sensor 205), a plurality of data samples corresponding to a physical parameter relating to a vehicle component. In some implementations, the sensor may be external to the ECU. In some implementations, the sensor interface component may be configured to generate estimation data based on the plurality of data samples. In some implementations, the estimation data may at least partially compensate for a delay, from a point in time at which a particular data sample, of the plurality of data samples, is detected by the sensor to a point in time at which the particular data sample is obtained by the sensor interface component, to approximate a current value of the physical parameter. In some implementations, the sensor interface component may be configured to receive, from the processor, one or more commands for physical parameter information, relating to the vehicle component, after generating the estimation data, and provide, to the processor, a portion of the estimation data based on the one or more commands.

In some implementations, the ECU may include one or more filter components to reduce electrostatic discharge or electromagnetic interference effects at an input of the sensor interface component. In some implementations, the sensor interface component may be implemented in an ASIC. In some implementations, the sensor interface component, when generating the estimation data, may generate the estimation data using statistical estimation. In some implementations, the sensor interface component may be communicatively coupled to the sensor via a PSI5, an SPI, an $I^2C$-based interface, or an SPC-based interface, the sensor interface component may be communicatively coupled to the processor via an SPI or a parallel interface.

In some implementations, a system may include a sensor (e.g., sensor 205) and an ECU (e.g., ECU 210). In some implementations, the ECU may include a processor (e.g., microcontroller 230) and a sensor interface component (e.g., sensor interface component 240) communicatively coupled to the processor. In some implementations, the sensor interface component may receive, from the sensor, measurement data corresponding to a physical parameter relating to a vehicle component, determine, based on the measurement data, prediction data that approximates a current value of the physical parameter, and cause portions of the prediction data to be provided to the processor based on requests submitted by the processor.

In some implementations, the ECU may include a peripheral component. In some implementations, the sensor interface component may be communicatively coupled to the processor via the peripheral component.

In some implementations, the sensor interface component, when determining the prediction data, may determine the prediction data using a Kalman filter and one or more correction values provided by the processor. In some implementations, the sensor interface component, when causing the portions of the prediction data to be provided to the processor, may cause the portions of the prediction data to be provided to the processor based on one or more trigger commands provided by the processor. In some implementations, the one or more trigger commands may include information regarding time points for which physical parameter data, relating to the vehicle component, is to be provided to the processor.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Some implementations, described herein, provide a sensor interface component 240 (e.g., an intelligent interface configuration) that is capable of receiving, from a sensor 205, data samples corresponding to a physical parameter (e.g., a position (e.g., a linear position, an angular position, and/or the like), an electrical current, a velocity, a pressure, a torque, and/or the like) relating to a vehicle component (e.g., a motor drive, a throttle, a lever, and/or the like, such as those included in an electric power steering (EPS) system and/or the like), and processing the data samples (e.g., using one or more of interpolation, prediction, and/or statistical filtering techniques) to derive estimation data. The estimation data may at least partially compensate for a delay, from a point in time at which a particular measurement is made by sensor 205 to a point in time at which a corresponding data sample is obtained by sensor interface component 240, to approximate an actual or current value of the physical parameter. In some implementations, sensor interface component 240 may be disposed within close proximity to an ECU 210 (e.g., sensor interface component 240 may be implemented in hardware and disposed on a PCB of ECU 210, implemented in hardware within a processor (e.g., a microcontroller 230) of ECU 210, and/or implemented in firmware within the processor), may obtain sampling triggers and/or readout commands from the processor (e.g., microcontroller 230) for physical parameter values relating to the vehicle component at specific time points, and may provide, to ECU 210, corresponding portions of the estimation data. In this way, sensor interface component 240 may "reconstruct," based on data samples received from sensor 205, predicted data that represents the real behavior of the vehicle component (e.g., the actual or current position, electrical current, velocity, pressure, and/or the like relating to the vehicle component). This enables ECU 210 to define measurement time points needed in internal algorithmic state-estimations, and receive (e.g., on demand, such as in real-time or near real-time), from sensor interface component 240, measurement data that closely approximates (e.g., that is time synchronized with) the actual values of a physical parameter relating to the vehicle component.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method, comprising:
obtaining, by a sensor interface component and from a sensor, a plurality of data samples corresponding to a physical parameter relating to a vehicle component,
the sensor interface component being incorporated in an electronic control unit (ECU),
the ECU including a control device;
generating, by the sensor interface component, estimation data based on the plurality of data samples,
the estimation data at least partially compensating for a delay, from a point in time at which a particular data sample, of the plurality of data samples, is detected by the sensor to a point in time at which the particular data sample is obtained by the sensor interface component, to approximate a current value of the physical parameter;
receiving, by the sensor interface component and from the control device, one or more commands for physical parameter information, relating to the vehicle component, after generating the estimation data,
the one or more commands including:
a readout command received by the sensor interface component via an electrical line, or
a readout command and a sampling trigger command received by the sensor interface component via separate electrical lines; and
providing, by the sensor interface component and to the control device, a portion of the estimation data based on the one or more commands.

2. The method of claim 1, wherein the control device includes a processor; and
wherein the sensor interface component is implemented in firmware, or hardware, in the processor.

3. The method of claim 1, wherein the sensor interface component and the control device are disposed on a printed circuit board (PCB) of the ECU; and
wherein the sensor interface component is separate from the control device.

4. The method of claim 1, wherein the sensor interface component is communicatively coupled to the sensor via a first interface that permits data transfer up to a first rate;
wherein the sensor interface component is communicatively coupled to the control device via a second interface that permits data transfer up to a second rate; and
wherein the second rate is greater than the first rate.

5. The method of claim 1, wherein values of the estimation data are time synchronized with actual values of the physical parameter relating to the vehicle component.

6. The method of claim 1, wherein generating the estimation data comprises:
generating the estimation data using interpolation, prediction, and/or statistical filtering.

7. The method of claim 1, further comprising:
receiving feedback data from the control device; and
wherein generating the estimation data comprises:
generating the estimation data based on the feedback data.

8. The method of claim 1, wherein the physical parameter includes:
linear position,
angular position,
electrical current,
voltage,
velocity,
pressure, or
torque.

9. The method of claim 1, wherein the estimation data further compensates for noise in the plurality of data samples.

10. The method of claim 1, wherein the sensor interface component is communicatively coupled to the sensor via a peripheral sensor interface 5 (PSI5), a serial peripheral interface (SPI), an inter-integrated circuit ($I^2C$)-based interface, or a short pulse width modulation code (SPC)-based interface.

11. An electronic control unit (ECU), comprising:
a printed circuit board (PCB);
a processor; and
a sensor interface component,
the sensor interface component and the processor being disposed on the PCB,
the sensor interface component being configured to:
obtain, from a sensor, a plurality of data samples corresponding to a physical parameter relating to a vehicle component,
the sensor being external to the ECU;

generate estimation data based on the plurality of data samples,
the estimation data at least partially compensating for a delay, from a point in time at which a particular data sample, of the plurality of data samples, is detected by the sensor to a point in time at which the particular data sample is obtained by the sensor interface component, to approximate a current value of the physical parameter;
receive, from the processor, one or more commands for physical parameter information, relating to the vehicle component, after generating the estimation data; and
provide, to the processor, a portion of the estimation data based on the one or more commands.

12. The ECU of claim 11, further comprising one or more filter components to reduce electrostatic discharge or electromagnetic interference effects at an input of the sensor interface component.

13. The ECU of claim 11, wherein the sensor interface component is implemented in an application-specific integrated circuit (ASIC).

14. The ECU of claim 11, wherein the sensor interface component, when generating the estimation data, is to:
generate the estimation data using statistical estimation.

15. The ECU of claim 11, wherein the sensor interface component is communicatively coupled to the sensor via a peripheral sensor interface 5 (PSI5), a serial peripheral interface (SPI), an inter-integrated circuit ($I^2C$)-based interface, or a short pulse width modulation code (SPC)-based interface; and
wherein the sensor interface component is communicatively coupled to the processor via an SPI or a parallel interface.

16. A system, comprising:
a sensor; and
an electronic control unit (ECU),
the ECU including:
a processor; and
a sensor interface component, communicatively coupled to the processor, to:
receive, from the sensor, measurement data corresponding to a physical parameter relating to a vehicle component;
determine, based on the measurement data, prediction data that approximates a current value of the physical parameter; and
cause portions of the prediction data to be provided to the processor based on requests submitted by the processor.

17. The system of claim 16, wherein the ECU further includes a peripheral component; and
wherein the sensor interface component is communicatively coupled to the processor via the peripheral component.

18. The system of claim 16, wherein the sensor interface component, when determining the prediction data, is to:
determine the prediction data using a Kalman filter and one or more correction values provided by the processor.

19. The system of claim 16, wherein the sensor interface component, when causing the portions of the prediction data to be provided to the processor, is to:
cause the portions of the prediction data to be provided to the processor based on one or more trigger commands provided by the processor; and
wherein the one or more trigger commands include information regarding time points for which physical parameter data, relating to the vehicle component, is to be provided to the processor.

20. The system of claim 16, wherein the sensor interface component is communicatively coupled to the sensor via a peripheral sensor interface 5 (PSI5), a serial peripheral interface (SPI), an inter-integrated circuit ($I^2C$)-based interface, or a short pulse width modulation code (SPC)-based interface.

* * * * *